US008271913B2

(12) United States Patent
Carmon et al.

(10) Patent No.: US 8,271,913 B2
(45) Date of Patent: Sep. 18, 2012

(54) METHOD AND SYSTEM FOR DESIGN AND MODELING OF TRANSMISSION LINES (75) Inventors: Roi Carmon, Haifa (IL); David Goren, Haifa (IL); Rachel Gordin, Haifa (IL); Shlomo Shlafman, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 410 days.

(21) Appl. No.: 12/564,061

(22) Filed: Sep. 22, 2009

(65) Prior Publication Data
US 2011/0072408 A1 Mar. 24, 2011

Related U.S. Application Data (62) Division of application No. 11/669,158, filed on Jan. 31, 2007, now Pat. No. 7,797,662.

(51) Int. Cl.
G06F 17/50 (2006.01)
(52) U.S. Cl. .......... 716/101; 716/126; 716/132; 703/14
(58) Field of Classification Search .................. 716/101, 716/126, 132
See application file for complete search history.

(56) References Cited

U.S. PATENT DOCUMENTS 7,080,340 B2   7/2006  Goren et al.
8,046,208 B1*  10/2011  Cai et al. .................... 703/13

OTHER PUBLICATIONS

J. Balachandran et al., "Analysis and Modeling of Power Grid Transmission lines", Proceedings of the conference on Design, automation and test in Europe, Session: Power grid and large interconnect network analysis table of contents, pp. 33-38, 2006.

P.J. Restle et al., "Measurement and modeling of on-chip transmission line effects in a 400 MHz microprocessor", IEEE Journal of Solid-State Circuits, v 33, n 4, Apr. 1998, p. 662-5.
K.Z. Dimopoulos et al., "Electrical modelling of lossy on-chip multilevel interconnecting lines", Proceedings of the European Conference on Design Automation, 1991, p. 106-10.
M. T. Yang et al., "On the millimeter-wave characteristics and model of on-chip interconnect transmission lines up to 110 GHz", Conference Article: 2005 IEEE MTT-S International Microwave Symposium (IEEE Cat. No. 05CH37620C), 2005, p. 4 pp.
A. Tsuchiya et al., "Substrate loss of on-chip transmission-lines with power/ground wires in lower layer", Proceedings. 9th IEEE Workshop on Signal Propagation on Interconnects (IEEE Cat. No. 05EX1048), 2005, p. 201-2.
A. Sinha et al. "Mesh-Structured On-Chip Power/Ground: Design for Minimum Inductance and Characterization for Fast R, L Extraction", Proceedings of the IEEE 1999 Custom Integrated Circuits Conference (Cat. No. 99CH36327), 1999, p. 461-5.
Goren, D. et al., "An Interconnect-Aware Methodology for Analog and Mixed Signal Design, Based on High Bandwidth (Over 40 GHz) On-chip Transmission Line Approach" IEEE Date'02 Conference, Paris Mar. 2002, pp. 804-811. Goren, D. et al., "On-chip Interconnect-Aware Design and Modeling Methodology, Based on High Bandwidth Transmission Line Devices", IEEE DAC'03 Conference, CA, Jun. 2003, pp. 724-727.
Gerard V. Kopscay et al., "A comprehensive 2-D inductance modeling approach for VLSI interconnects: Frequency-dependent extraction and compact circuit model synthesis", IEEE Transactions on Very Large Scale Integration (VLSI) Systems, v 10, n 6, Dec. 2002, p. 695-711.

* cited by examiner

Primary Examiner — Thuan Do (57) ABSTRACT

A method and system for design and modeling of transmission lines are provided. The method includes providing a set of models of core structures (211) of transmission line cells and expanding each of the models of core structures (211) to include different neighboring elements. The parameter characteristics of the expanded core structures (214a-214c) are compared to determine a model having a minimal sufficiently closed neighborhood environment. A closed neighborhood environment complies with design rules to ensure desired transmission line behavior in a real design environment. A model having a closed neighborhood environment can be used as a stand-alone model of the core structure describing the transmission line behavior in the actual design environment.

6 Claims, 13 Drawing Sheets

METHOD AND SYSTEM FOR DESIGN AND MODELING OF TRANSMISSION LINES

CROSS-REFERENCE TO RELATED APPLICATIONS

The subject Application is a divisional of U.S. patent application Ser. No. 11/669,158 (now U.S. Pat. No. 7,797,662), filed Jan. 31, 2007.

FIELD OF THE INVENTION

This invention relates to the field of design and modeling of transmission lines. In particular, the invention relates to on-chip transmission line design and modeling in dense VLSI design environment.

BACKGROUND OF THE INVENTION

In multi-GHz chip design domains, interconnects are becoming the limiting factor in the performance, energy dissipation, and signal integrity. The demanding requirements from on-chip wiring pose a serious problem, both from the design and the modeling aspects.

Previous solutions for considering on-chip interconnects have focused on analysis of given designs. These include RC(L) extraction methods and analysis tools based on field solvers.

The attempts to develop post-layout RCL extraction methods usually fail to correctly determine the wire inductances, due to the inability to determine the correct current return paths. In addition, existing RC(L) extraction tools do not take into account several physical effects, such as substrate effects, which are expected to have a significant impact on the design performance.

The field solver based analysis tools require the user to define the relevant solution domain including the interconnect to be analyzed, as well as the boundary conditions, for which a deep electromagnetic understanding is needed. As a result, the solution domain can be either redundant or insufficient, or both, which leads to errors that are almost impossible to track.

SUMMARY OF THE INVENTION

It is an aim of the present invention to design on-chip transmission lines (T-lines) so that they ensure the desired T-line performance in an actual VLSI design neighborhood. It is a further aim to define a closed environment of a T-line to be considered in its model so that the model becomes self-contained.

According to a first aspect of the present invention there is provided a method for design and modeling of transmission lines, comprising: providing a set of models of core structures of transmission line cells; expanding each of the models of core structures to include different neighboring elements; comparing the parameter characteristics of the expanded core structures to determine a model having a minimal sufficiently closed neighborhood environment.

The method may include selecting the model having the minimal sufficiently closed neighborhood environment to model a transmission line. A closed neighborhood environment may comply with design rules to ensure desired transmission line behaviour in a real design environment.

A model having a closed neighborhood environment may be a stand-alone model of the core structure describing the transmission line behaviour in the actual design environment.

The parameter characteristics may be one of: time domain characteristics, frequency domain characteristics, or equivalent transmission line characteristics.

The method may include carrying out small circuit simulations using the expanded core structures.

The models of transmission line core structures may be single or coupled transmission lines with dedicated shields serving as current return paths. Each model of a transmission line core structure may be modeled for a set of parameters with optimized geometry to minimize sensitivity to the design neighborhood of the transmission line.

Comparing the parameter characteristics may be carried out by computing parameters by an electromagnetic solver.

The transmission lines may be in dense VLSI design environments.

The neighborhood elements may include crossover and crossunder lines above and below a signal wire, parallel lines exactly above and/or below a signal wire, the silicon substrate, and parallel coplanar lines outside the core structure (coplanar neighbors).

According to a second aspect of the present invention there is provided a method for design and modeling of transmission lines, comprising: identifying a critical path; formulating design requirements for the critical path; choosing a transmission line core structure from a set of models of core structures; identifying the neighboring elements of the transmission line; and choosing the transmission line geometry parameters based on the design requirements and on simulations using expanded core structure models.

The design requirements may be electrical and geometrical requirements.

The expanded core structure models may include different neighboring elements and the parameter characteristics of the expanded core structures may be compared to determine a model having a minimal sufficiently closed neighborhood environment.

According to a third aspect of the present invention there is provided a system for design and modeling of transmission lines, comprising: means for providing a set of models of core structures of transmission line cells; means for selecting a model of a core structure; means for providing a set of expanded models for each of the models of core structures, the expanded models including different neighboring elements of the core structure; and means for comparing the parameter characteristics of the expanded core structures to determine a model having a minimal sufficiently closed neighborhood environment.

The system may include means for carrying out small circuit simulations using the expanded core structures. The system may include an electromagnetic solver for computing and comparing the parameter characteristics.

According to a fourth aspect of the present invention there is provided a computer program product stored on a computer readable storage medium for design and modeling of transmission lines, comprising computer readable program code means for performing the steps of: providing a set of models of core structures of transmission line cells; expanding each of the models of core structures to include different neighboring elements; comparing the parameter characteristics of the expanded core structures to determine a model having a minimal sufficiently closed neighborhood environment.

According to a fifth aspect of the present invention there is provided a computer program product stored on a computer readable storage medium for design and modeling of transmission lines, comprising computer readable program code means for performing the steps of: identifying a critical path; formulating design requirements for the critical path; choosing a transmission line core structure from a set of models of core structures; identifying the neighboring elements of the transmission line; and choosing the transmission line geometry parameters based on the design requirements and on simulations using expanded core structure models.

The suggested solution is based on a suggested concept of "closed design environment". The "closed environment" of a given interconnect structure is defined as a design fragment including the structure itself ("core structure") and some other design elements which affect its behavior ("closed neighborhood"), such that the whole fragment can be accurately represented by a self-contained model of the core structure in the actual design environment.

The T-line "closed environment" concept has two interdependent aspects: proper design and proper modeling.

Proper design refers to compliance with certain design rules which ensure the desired T-line behavior in a real design environment. These rules may specify ranges of wires widths and spacings, require excluding parallel wires right above or below the signal line, etc.

Proper modeling refers to the ability of stand-alone models to describe the properly designed T-lines behavior in a real design environment.

BRIEF DESCRIPTION OF THE DRAWINGS

The subject matter regarded as the invention is particularly pointed out and distinctly claimed in the concluding portion of the specification. The invention, both as to organization and method of operation, together with objects, features, and advantages thereof, may best be understood by reference to the following detailed description when read with the accompanying drawings in which:

FIGS. 4A to 4D are cross-sections of T-line core structures in different neighborhoods in accordance with an aspect of the present invention;

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numbers may be repeated among the figures to indicate corresponding or analogous features.

DETAILED DESCRIPTION OF THE INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Interconnect-aware design and modeling methodology provides a comprehensive solution for on-chip wiring design and modeling. Further information is provided in references: Goren, D. et al., "An Interconnect-Aware Methodology for Analog and Mixed Signal Design, Based on High Bandwidth (Over 40 GHz) On-chip Transmission Line Approach" IEEE DATE'02 Conference, Paris March 2002, pp. 804-811 and Goren, D. et al., "On-chip Interconnect-Aware Design and Modeling Methodology, Based on High Bandwidth Transmission Line Devices", IEEE DAC'03 Conference, CA, June 2003, pp. 724-727.

The basis of this methodology is that the wires in which transmission line effects are pronounced ("critical wires") are identified already at the pre-layout design stages. The critical wires are then designed differently, using a unique set of transmission line devices, called "on-chip T-lines", which contain their own dedicated shields serving as the current return paths. For these T-lines, semi-analytical models have been developed which predict their full frequency dependent behavior from DC up to the cut-off frequency of the transistors in the given technology. For non-critical wires, which usually go through multiple changes during the design process, post-layout RC extraction is used.

A central point of the described design and modeling methodology is the concept of "closed environment". The "closed environment" of a given interconnect structure is defined as a design fragment including the structure itself ("core structure") and some other design elements which affect its behavior ("closed neighborhood"), such that the whole fragment can be accurately represented by a stand-alone, independent model of the core structure in the actual design environment.

The T-line "closed environment" concept has two interdependent aspects: proper design and proper modeling. Proper design refers to compliance with certain design rules which ensure the desired T-line behavior in a real design environment (these rules may specify ranges of wires widths and spacings, require excluding parallel wires right above or below the signal line, etc.). Proper modeling refers to the ability of stand-alone models to describe the properly designed T-lines behavior in a real design environment.

The behavior of coplanar T-lines in dense VLSI Manhattan designs is strongly affected by their neighbor wires and/or by the silicon substrate, so that in this case, a coplanar on-chip T-line closed environment is never confined to its core structure. The described methodology finds practical criteria for a minimal "sufficiently closed" environment of the coplanar on-chip T-lines in dense VLSI design environments.

Figure 1A:
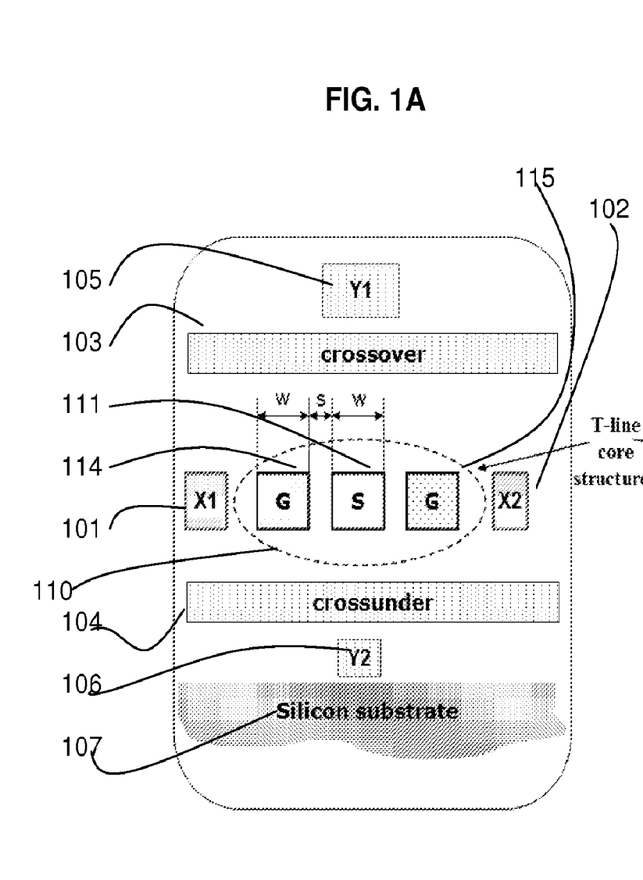
FIGS. 1A and 1B are cross-sections of coplanar T-lines in typical VLSI environments.
Figure 1B:
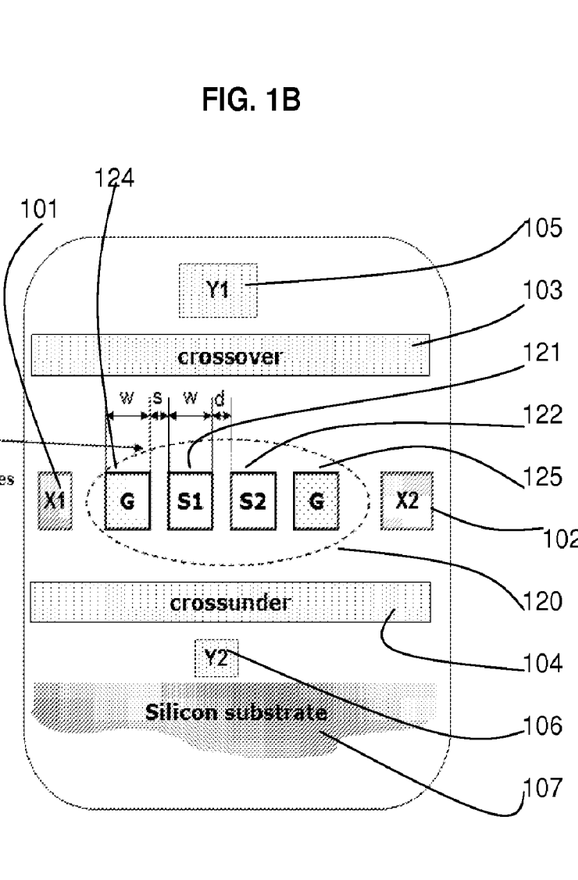

FIGS. 1A and 1B show the coplanar single 110 and coupled 120 T-lines core structures, surrounded by neighborhoods typical for the VLSI Manhattan design.

The coplanar single T-lines core structure 110 has a single signal line 111 and two side shield lines 114,115. The width of the signal 111 and side shield lines 114, 115 is defined as "w" and the spacing between the signal line 111 and a side shield line 112, 113 is defined as "s".

The coplanar coupled T-lines core structure 120 has two signal lines S1 121, S2 122 and side shield lines 124, 125. The width of the signal lines 121, 122 and side shield lines 124, 125 is defined as "w" and the spacing between a signal line 121, 122 and a side shield line 124, 125 is defined as "s". The spacing between the two signal lines 121, 122 is defined as "d".

For both the coplanar single and coupled T-line core structures 110, 120, a T-line neighborhood may include parallel wires in the T-line layer (X1, X2) 101, 102, crossing (orthogonal) wires right above and below (crossover, crossunder) 103, 104, parallel wires above and below the orthogonal wires (Y1, Y2) 105, 106, and the silicon substrate 107. Xi, Yi may stand for multiple wires. In a Manhattan environment, a T-line core structure is located either above an adjacent crossunder, or right above the silicon substrate.

In order to define the closed environment of a given T-line, the models of different structures, built by combining the T-line core structure with different groups of elements from its neighborhood, need to be compared. The comparison between the models can be performed using various criteria: time domain characteristics (delay, rise time, signal integrity parameters) and frequency domain characteristics (S-parameters, equivalent transmission line characteristics $\gamma$-$Z_0$, equivalent frequency dependent circuit parameters RLCG).

In VLSI design analysis, time domain characterization is the common practice. However, time domain parameters describe the behavior of the critical wiring as a part of specific drivers/receivers setup rather than a stand-alone entity. Frequency domain characteristics allow for a compact and complete representation of the wire characteristics in a given bandwidth. This is why these characteristics are used both by EM solvers and by all broadband measurement equipment.

The described method of design and modeling includes the step of analyzing the frequency dependent circuit parameters of different structures including the same coplanar T-line core structure. This analysis is necessary for obtaining proper T-line design rules and for building their correct models. Then, different structures including the same T-line core structure, are compared using their frequency domain characteristics computed by an EM solver, in order to verify that the suggested T-line environments are sufficiently closed.

T-line structures used to design critical wiring are "long" in a sense that they are featured by a small ratio of their cross-section characteristic dimension to wire length (usually less than 2%). Therefore, both the theoretical and the numerical analysis are performed using the 2D approach.

Figure 2A:
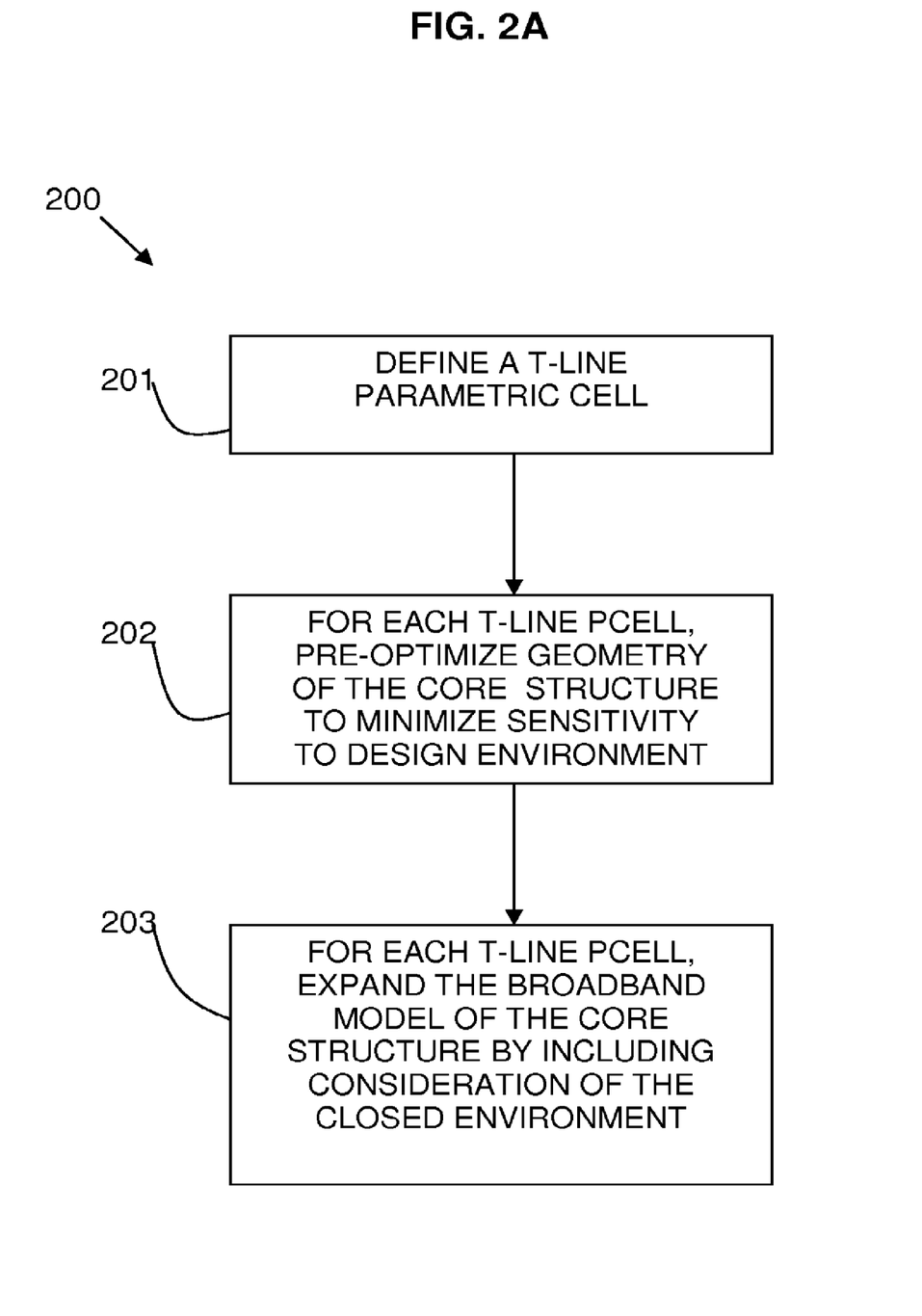
FIG. 2A is a flow diagram of a method in accordance with an aspect of the present invention.

FIG. 2A is a flow diagram 200 of a method of design and modeling. The method includes defining 201a T-line parametric cell (Pcell) in which parameters of the cell are defined. For each T-line Pcell, the geometry is optimized 202 to minimize the sensitivity of the cell to the design environment. For example, as shown further below, for a single coplanar T-line Pcell, the geometry is set so $w_{signal} \leq w_{shield} \leq 2*w_{signal}$. For each T-line Pcell, the broadband model of the core structure is expanded 203 by including consideration of the closed environment.

Figure 2B:
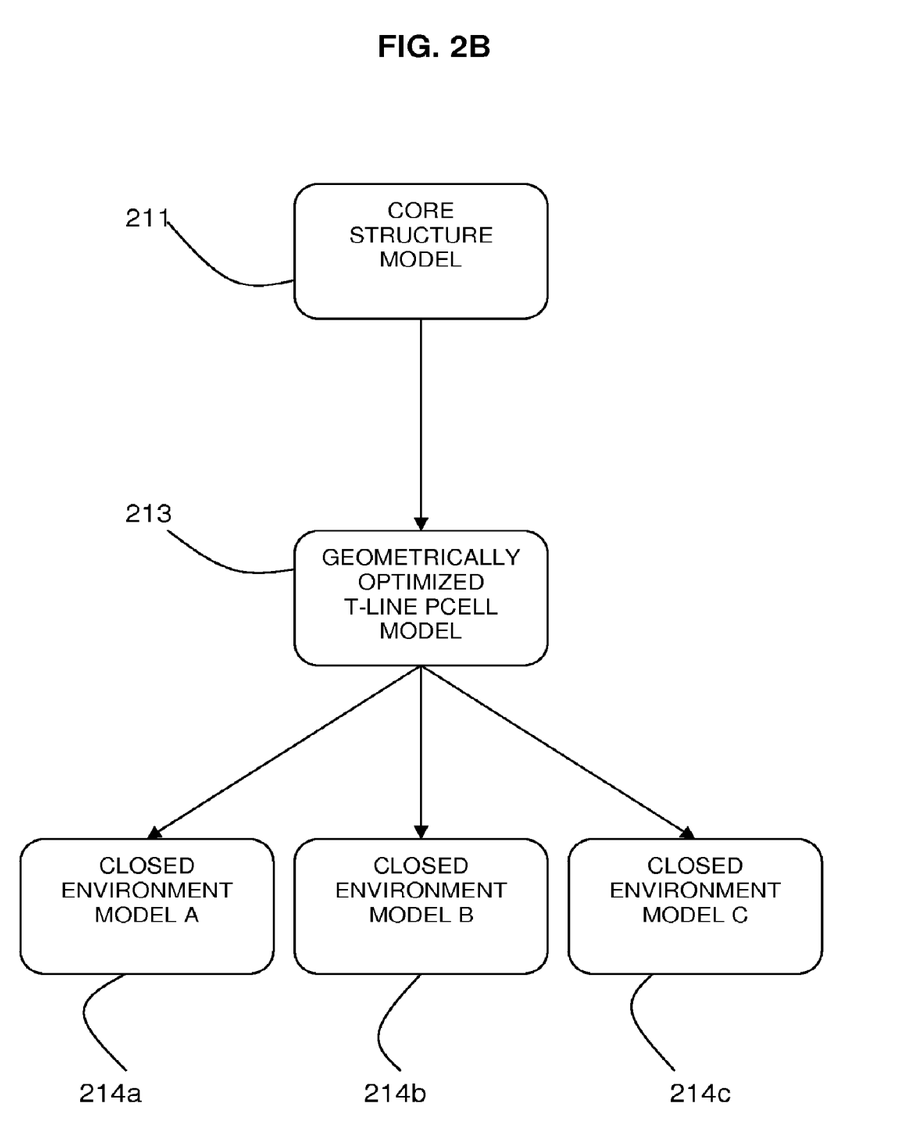
FIG. 2B is a schematic diagram of modeling components of the method of FIG. 2A.

FIG. 2B illustrates the method of FIG. 2A schematically. A parametric core structure model 211 for each T-line is defined as an electric circuit having fixed topology (which may differ from T-line to T-line) whose RLC parameters are defined as functions of geometrical parameters of the core structure and technology parameters. The core structure model 211 is optimized geometrically to provide a geometrically optimized T-line Pcell model 213. The geometrically optimized T-line Pcell model 213 is expanded to include multiple different neighborhoods which provide a closed environment. For each neighborhood, this results in a model 214a, 214b, 214c of the closed environment for the original core structure 211, which has the same circuit topology as the original core structure, but differs by functions defining RLC parameters, expanded to include the impact of the respective neighborhood. The diagram shows three models 214a, 214b, 214c, however this is for illustration purposes only and a set may contain any number of models.

Closed Environment Conditions

The conditions which ensure that a given T-line structure can be represented by a stand-alone model are considered, these are referred to as the closed environment conditions. In order to better understand the physics behind the close environment conditions, they are expressed in terms of frequency dependent circuit parameters R(f), C(f), G(f), L(f).

R(f): The computational model of a stand-alone T-line structure yields the DC resistance, $R_{DC}$, as the sum of the signal wire resistance $R_{signal}$ and resistance of the shields $R_{shield}$. However, in the actual VLSI design environment, the DC current return path of the T-line structure is not confined to its shields, e.g. it includes the power grid, so that the resistance of the actual DC current return path is negligible relative to $R_{signal}$. Therefore, in an actual design environment, $R_{DC}$ of a T-line structure is equal to $R_{signal}$, and a stand-alone T-line model should be modified by setting $R_{DC} = R_{signal}$.

The theoretical and numeric study of wideband behavior of coplanar T-lines above the lossy substrate given in Goren, D. et al., "Modeling Methodology of On-Chip Coplanar Transmission Lines over the Lossy Silicon Substrate", SPI'03, Siena, May 2003, supported by comprehensive measurements on a specially designed test site, has shown that the return current in the silicon substrate is small for practical silicon resistivities up to 100 GHz. Hence, the presence of the substrate right below the T-lines does not influence their resistance in the whole bandwidth of interest.

The frequency dependence of the T-line resistance is caused by the skin-effect, so this dependence starts at skin-effect initial frequency First consider the case when there are no parallel wires exactly above and/or below the signal wire. Then, due to the proximity effect, the dedicated T-line shields become the preferred current return path at frequency $f_{ret}$ which is lower than the skin-effect initial frequency ($f_{ret} < f_i$). Hence, in the absence of parallel wires exactly above and/or below the signal wire, the stand-alone model of the T-line frequency dependent resistance developed for its core structure will be correct also in the actual design environment. If there are parallel wires exactly above and/or below the signal wire, they become a part of the preferred current return path, which may affect the frequency dependent resistance.

C(f) and G(f): In a dense VLSI Manhattan design, a T-line neighborhood includes either two adjacent crossings above and below, or an adjacent crossover and the silicon substrate right below. In such a neighborhood, the capacitance of a T-line structure significantly differs from the capacitance of its core structure.

In the presence of silicon substrate right below the T-lines, due to the substrate losses, their conductance G may becomes considerable, and both capacitance and conductance vary significantly over the bandwidth of interest. The impact of the parallel wires (X1, X2, Y1 of FIGS. 1A and 1B) on the T-lines capacitance is insignificant. Therefore, in this case, a stand-alone model of the T-line capacitance should take into account the adjacent crossover, as well as the lossy substrate.

In the presence of a dense crossunder, the silicon substrate influence on the T-line capacitance and conductance can be neglected. In this case, the capacitance is frequency independent, and the conductance is negligible. The impact of the parallel wires (X1, X2, Y1, Y2 of FIGS. 1A and 1B) is still insignificant, so the crossings are the main factor which affects the T-lines capacitance. Therefore, a stand-alone model of the T-line capacitance should take into account both adjacent crossings.

L(f): The fact that the return current in the silicon substrate is small, also implies that the presence of the silicon substrate does not influence the T-lines inductance. Therefore, a stand-alone model of the T-line inductance does not need to consider the silicon substrate.

The wires which can affect the T-line inductance include the coplanar neighbors (X1, X2) and parallel wires (Y1, Y2). The frequency at which the inductance effects become significant is denoted by $f_{ind}$. If at frequency $f_{ind}$ most of the return current flows through the T-line dedicated return path (i.e. $f_{ret}$ is close to $f_{ind}$), then the presence of parallel wires does not affect the T-line inductance. The extent this happens in practice has been considered.

Since $f_{ret} < f_i$, the ratio $f_{ret}/f_{ind}$ is bounded from above by $f_i/f_{ind}$. The expression for $f_{ind}$ can be obtained based on the $t_{rise}$:

$$2\sqrt{(L_\infty C)} = t_{rise} = 1/(2f_{ind}),$$

which gives $$1/f_{ind} = 4\sqrt{(L_\infty C)}.$$

The skin-effect initial frequency $f_i$ can be estimated as $$f_i = (1/2\pi) R_{DC}/(L_0 - L_\infty), \text{hence,}$$

$$f_i/f_{ind} = (2/\pi)(R_{DC}\sqrt{(L_\infty/C)})/(L_0/L_\infty - 1).$$

The inductance effects are negligible if $R_{DC} > 2\sqrt{(L_\infty/C)}$. Since the inductance impact is studied, the case of interest is $R_{DC} \leq 2\sqrt{(L_\infty/C)}$, for which $$f_{ret}/f_{ind} < f_i/f_{ind} < (4/\pi)/(L_0/L_\infty - 1).$$

The last estimation helps to understand when $f_{ret}$ and $f_{ind}$ can be considered as close to each other in terms of the impact on inductance. The skin depth is proportional to $\sqrt{f}$, and the effective distance from the signal line to the return current (proximity effect) changes even slower than this. The inductance is a logarithmic function of this effective distance. In case of the T-line core structures with $w = w_{shield}$ (as shown in FIGS. 1A and 1B), this gives $L_0/L_\infty > \sqrt{2}$, so $f_{ret}/f_{ind} < 3$. The ratio of the corresponding skin depth values is $\sqrt{3}$, and the effective distance varies by less than that. Such a change in the effective distance results in a very small variation of the inductance. Moreover, the sensitivity of the signal waveforms to the exact value of the inductance is low. Therefore, in this case, a stand-alone model of the T-line inductance does not need to consider parallel wires (X1, X2, Y1, Y2 in FIGS. 1A and 1B).

Coplanar T-Lines Core Structures

The geometry of the coplanar T-lines core structures is indicated in FIGS. 1A and 1B. A designer can choose the metal layer (which defines the surrounding dielectric structure and the wires thickness t), the distances between the wires (d and s), and the wires width w.

The shield width $w_{shield}$ is normally set equal to w. There are several reasons for keeping the same signal and shield width. First, as seen in the previous section, at frequencies where inductance effects and/or skin-effect are significant, such dedicated shields practically turn into the preferred current return path. Second, in the range $w \leq w_{shield} \leq 2w$, the low frequency inductance is close to its minimum and virtually insensitive to the shield width variation.

Figure 3A:
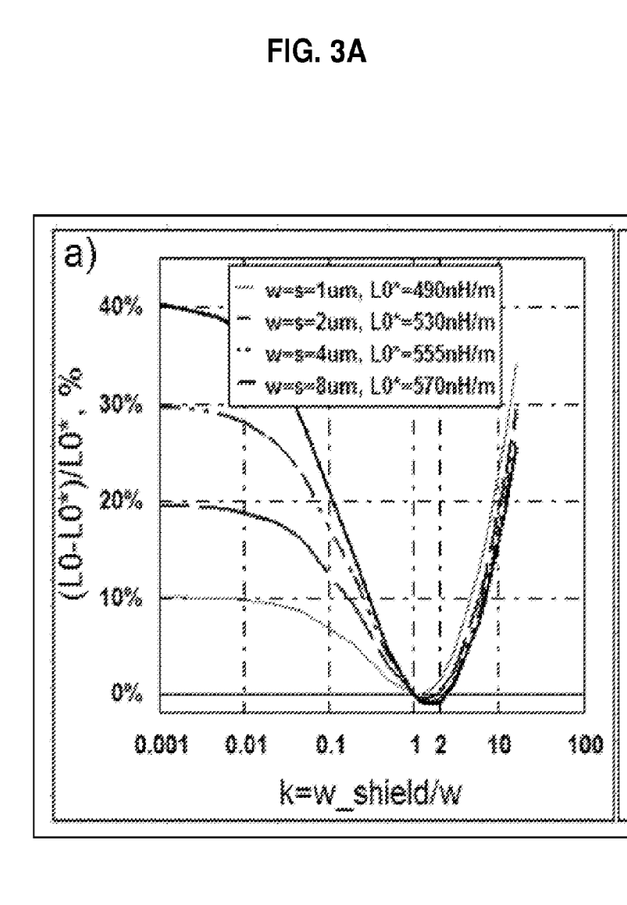
FIGS. 3A and 3B are graphs showing geometric optimization of a T-line core structure in accordance with an aspect of the present invention.
Figure 3B:
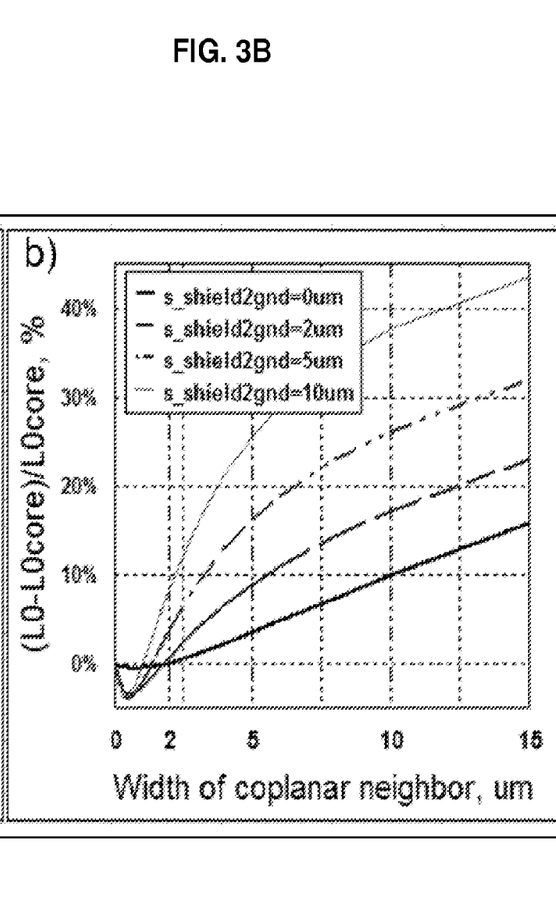

FIGS. 3A and 3B show the impact of shields on the single T-line low frequency inductance. FIG. 3A shows the impact of dedicated shields on the core structure inductance (no coplanar neighbors), $L0^* = L0(w_{shield} = w = s)$, and FIG. 3B shows the impact of coplanar neighbors X1-2, $L0_{core}$—inductance of the core structure with $w_{shield} = w = s = 2$ um. The graphs show that in the range $w \leq w_{shield} \leq 2w$, the low frequency inductance is close to its minimum and virtually insensitive to the shield width variation for a single coplanar T-line structure. This illustrates the meaning of "geometry optimization".

Lastly, the shields' width cannot be too large due to design area constraints. For $w_{shield} = w$, a T-line core structure occupies a minimal area on silicon while still keeping its behavior well predictable.

Impact of a T-Line Neighborhood on its Frequency Domain Parameters

The theoretical and numerical study of the silicon substrate has been presented in Goren, D. et al., "Modeling Methodology of On-Chip Coplanar Transmission Lines over the Lossy Silicon Substrate", SPI'03, Siena, May 2003. Therefore, the impact of other parts of the T-line typical VLSI neighborhood is now considered.

FIGS. 4A to 4D show four different design neighborhoods for a T-line core structure which were investigated as an example. The core structure 410 is the same as that of FIG. 1A with a single signal line 411 with two side shield lines 414, 415.

Figures 4A, 4D:
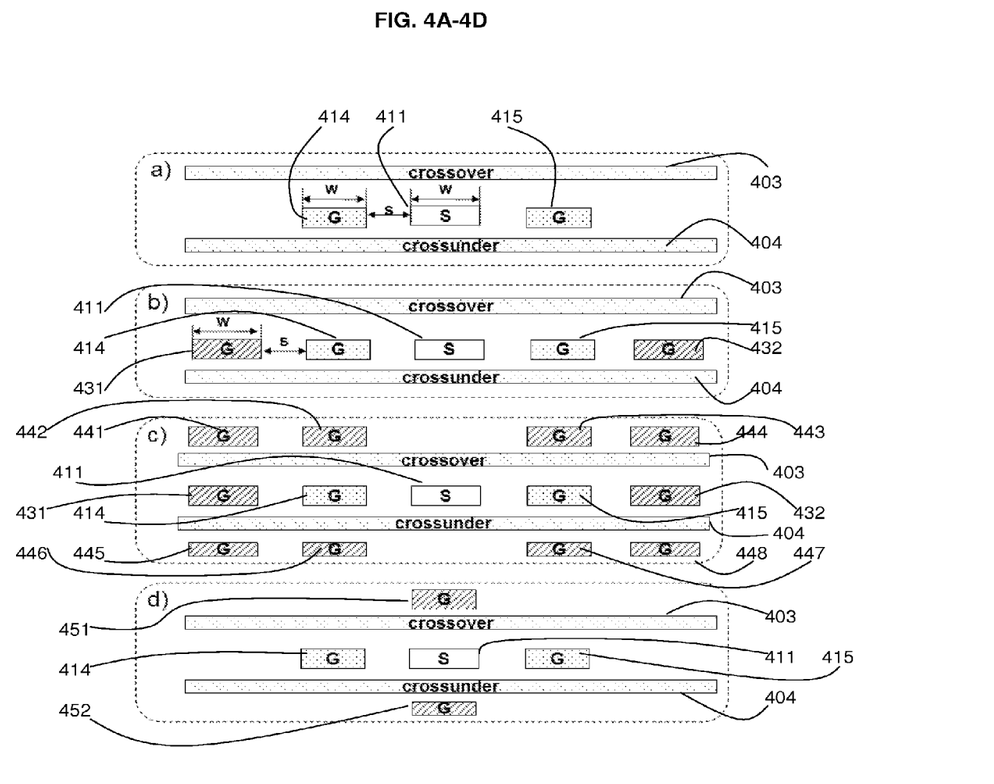

In FIG. 4A, the neighborhood includes a crossover line 403 and a crossunder line 404. In FIG. 4B, the neighborhood includes a crossover line 403 and a crossunder line 404 and additional side signal lines 431, 432. In FIG. 4C, the neighborhood includes the lines of FIG. 4B, with additional shield lines 441-448 above and below the crossover and crossunder lines 403, 404. In FIG. 4D, the neighborhood includes a crossover line 403 and a crossunder line 404, a shield line 451 above the crossover line 403 and directly above the signal line 411, and a shield line 452 below the crossunder line 404 and directly below the signal line 411.

Since the T-line models include the power grid influence and therefore assume $R_{DC} = R_{signal}$, $R_{shield}$ has been subtracted from all the EM solver results presented.

FIGS. 5A, 5B, 6A, 6B, 7A and 7B, show frequency domain characteristics of the test structures of FIGS. 4A to 4D for a practical case of single coplanar T-line core structure with w=s=2 um, t=0.35 um, and the actual non-uniform dielectric.

Figure 5A:
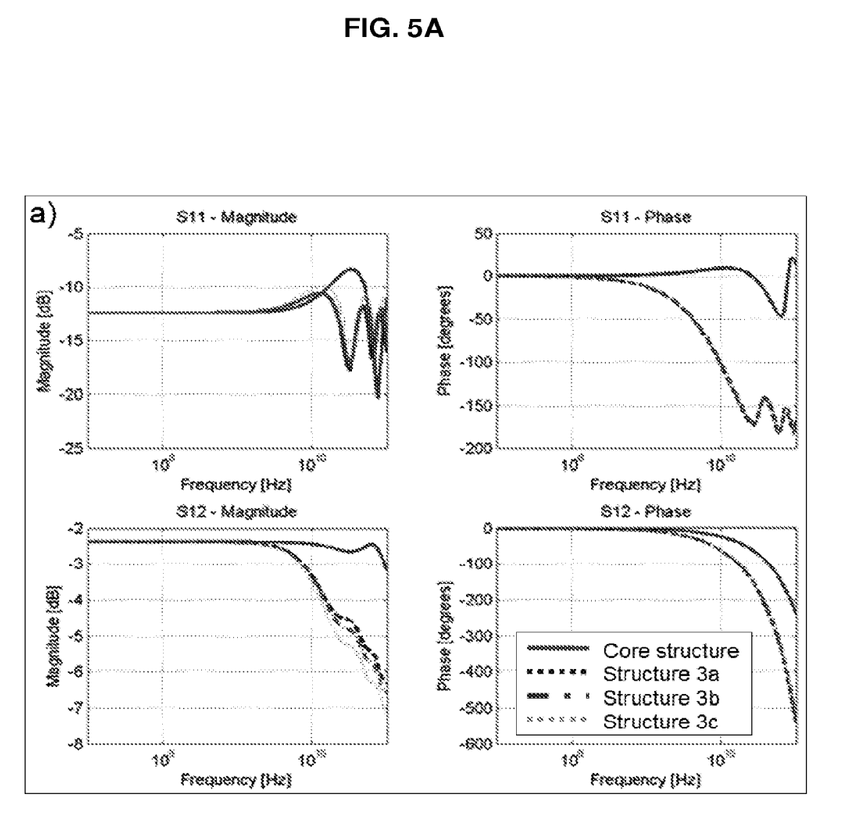
FIGS. 5A and 5B are graphs showing the impact of neighborhood on T-line core structure behavior in accordance with an aspect of the present invention.
Figure 5B:
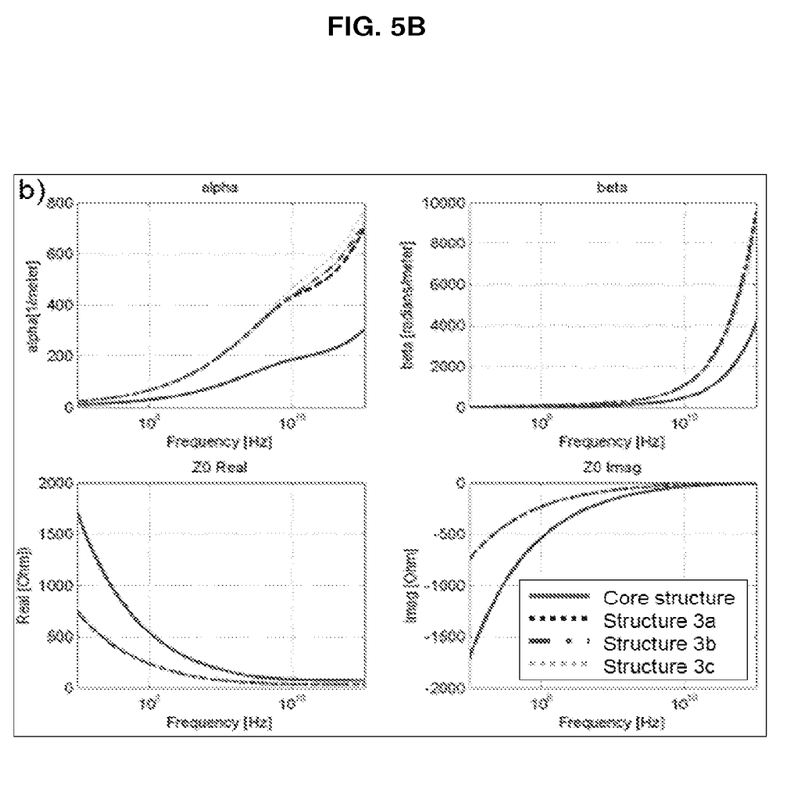

FIGS. 5A and 5B show the impact of neighborhood on the T-line core structure behavior of the test structures of FIGS. 4A to 4C. FIG. 5A shows the S-parameters and FIG. 5B shows the $\gamma$-$Z_0$ characteristics.

The graphs clearly show that for such structures, the crossing wires are the dominant factor which determines the T-line behavior. Therefore, in the absence of parallel wires exactly above and/or below the signal wire, the structure of FIG. 4A can be considered as a sufficiently closed environment of the coplanar T-line.

Figure 6A:
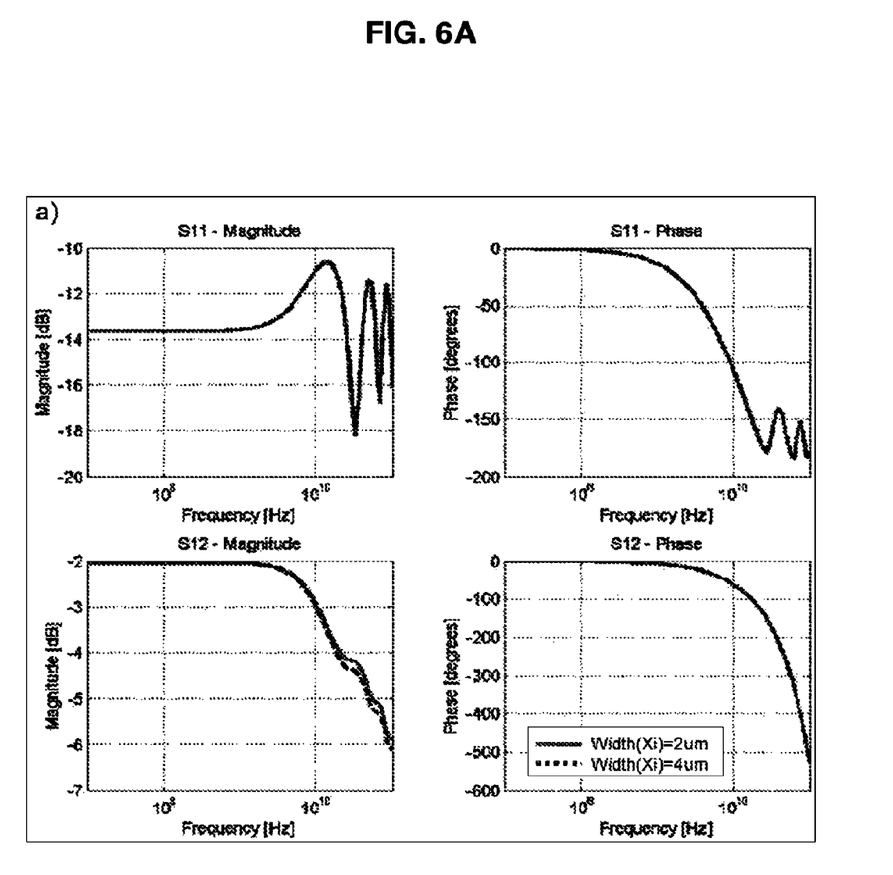
FIGS. 6A and 6B are graphs showing the impact of width of coplanar neighbors in accordance with an aspect of the present invention.
Figure 6B:
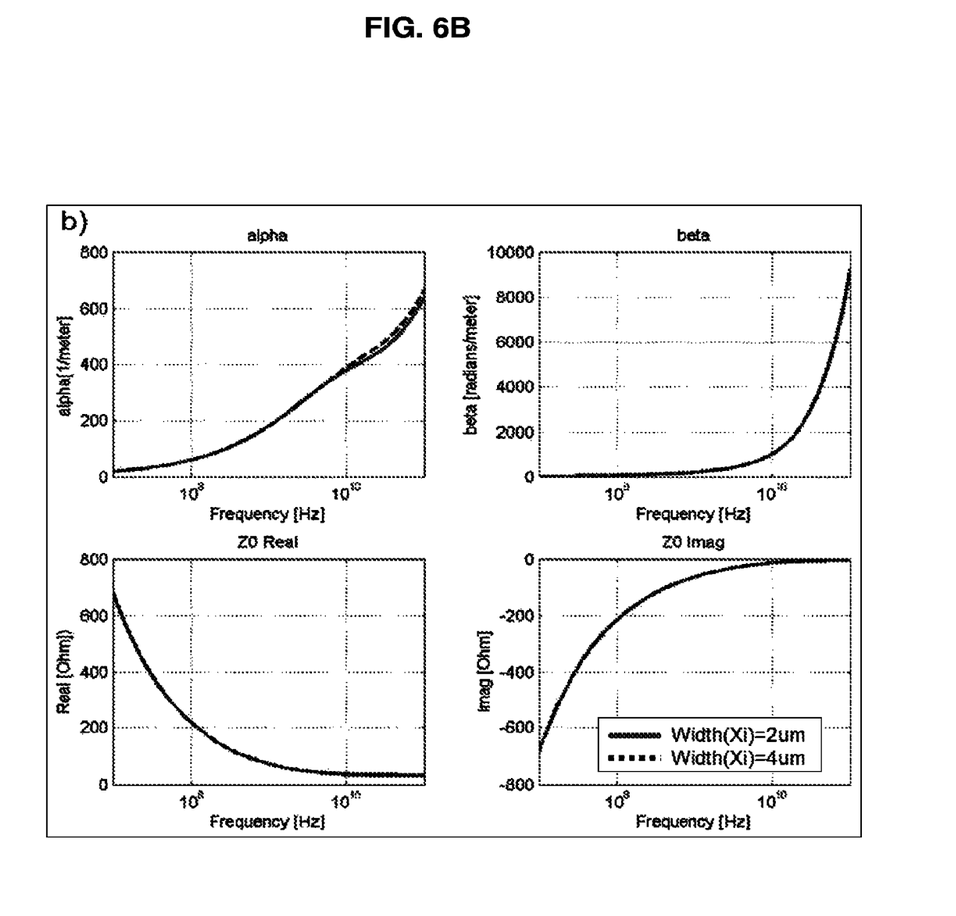

FIGS. 6A and 6B show the impact of the width of coplanar neighbors as shown in the test structure of FIG. 4B. FIG. 6A shows the S-parameters, and FIG. 6B shows the $\gamma$-$Z_0$ characteristics. In the presence of crossings, the impact of the width of coplanar neighbors is quite small.

Figure 7A:
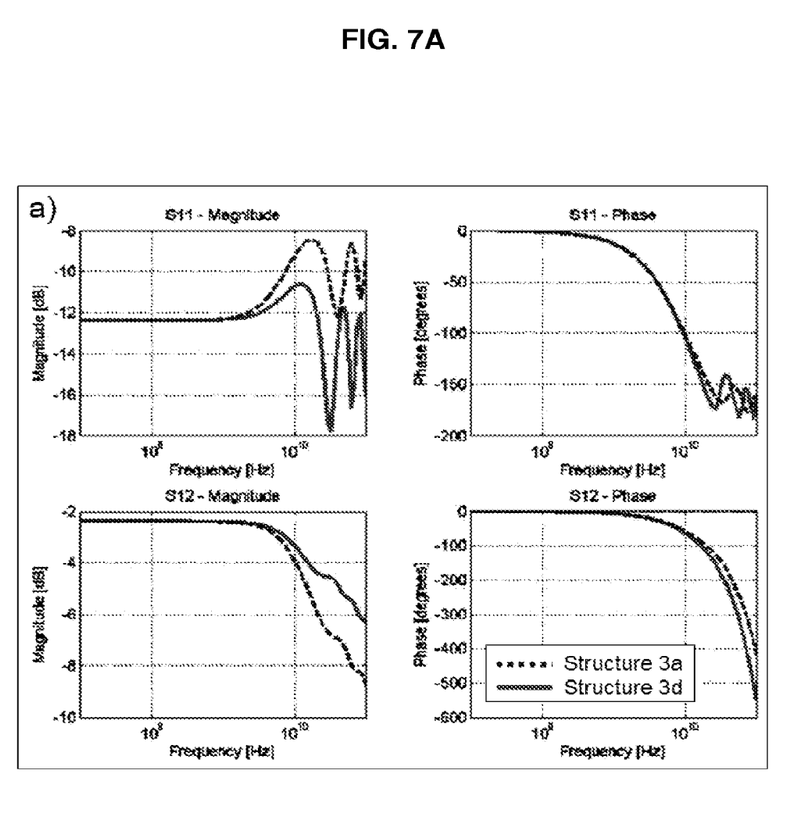
FIGS. 7A and 7B are graphs showing the impact of parallel wires exactly above and below a signal wire in accordance with an aspect of the present invention.
Figure 7B:
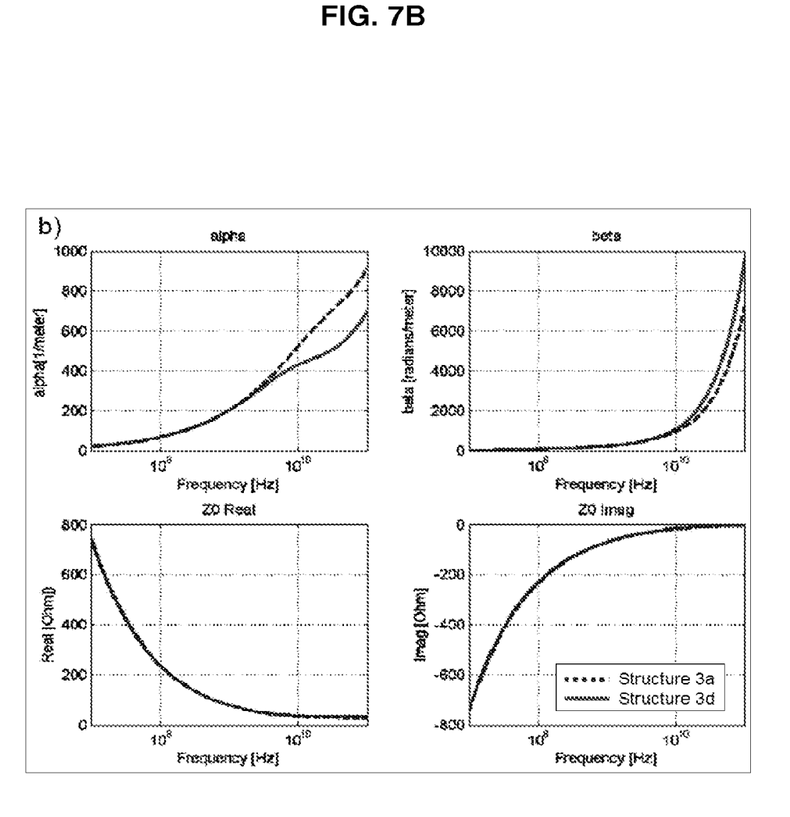

FIGS. 7A and 7B show the influence of parallel wires located exactly above and below the signal in the presence of crossings. FIG. 7A shows the S-parameters, and FIG. 7B shows the $\gamma$-$Z_0$ characteristics for the test structures of FIG. 4A and FIG. 4D. This influence is pronounced mainly in the signal attenuation and depends on the width of these parallel wires. In cases where the attenuation in the critical wires is important, such parallel wires are best avoided, or considered as a part of the closed environment.

It has been shown here that a stand-alone model for a critical line in a VLSI Manhattan environment is possible in most common cases, provided that the model is modified and expanded to include some environment elements, such as the crossing lines, the silicon substrate, and the correction of the DC resistance due to the power grid.

Figure 8:
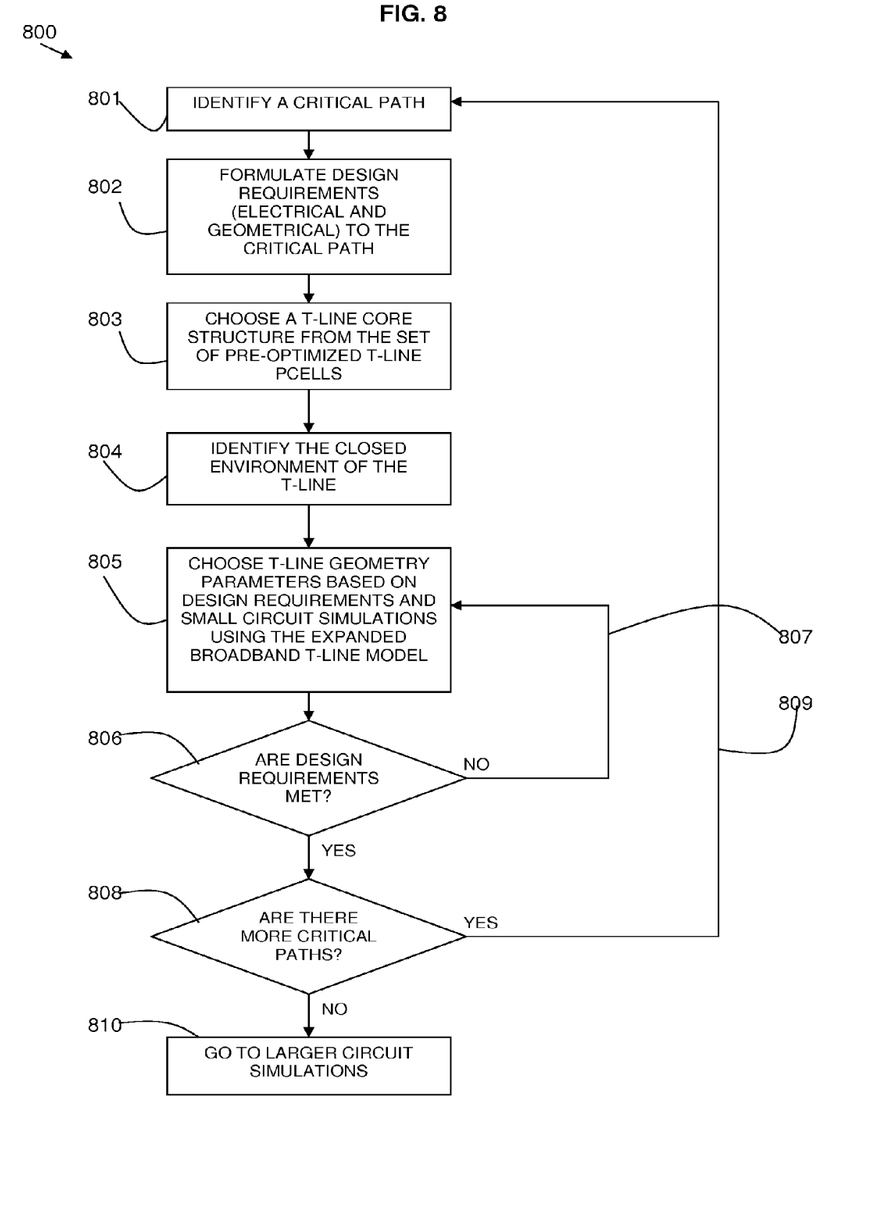
FIG. 8 is a flow diagram of a method in accordance with an aspect of the present invention.

Referring to FIG. 8, a flow diagram 800 is provided of a method carried out for each critical path. A critical path is identified 801 and the design requirements are formulated 802 for the critical path, such as the electrical and geometric requirements. A T-line core structure is chosen 803 from a set of pre-optimized T-line Pcells. For example, this set may be as provided in step 202 of FIG. 2A.

The closed environment of the T-line is then identified 804 and the T-line geometry parameters are chosen 805 based on design requirements and small circuit simulations using the expanded broadband T-line models. For example, this set may be as provided in step 203 of FIG. 2A.

It is then determined 806 if the design requirements are met. If not, then the method loops 807 to choose 805 other values of the T-line parameters. If the design requirements are met, it is then determined 808 is there are more critical paths. If so, the method loops 809 and repeats for the next critical path 801. If not, the method proceeds to larger circuit simulations 810.

An integrated circuit design system for implementing a design process including modeling T-lines may be provided. The design system is implemented by specialized CAD software running on a computer processor providing an interface with a designer. The designer controls the design process by appropriate inputs to the system.

The IC design system includes means for modeling T-lines including the methods described in FIGS. 2A and 8. The means for modeling T-lines may be provided in the form of a computer program product. An IC design flow which employs modeling of the critical on-chip wires is disclosed in detail in U.S. Pat. No. 7,080,340 for "Interconnect-Aware Integrated Circuit Design", filed Nov. 26, 2003, and issued Jul. 18, 2006.

Figure 9:
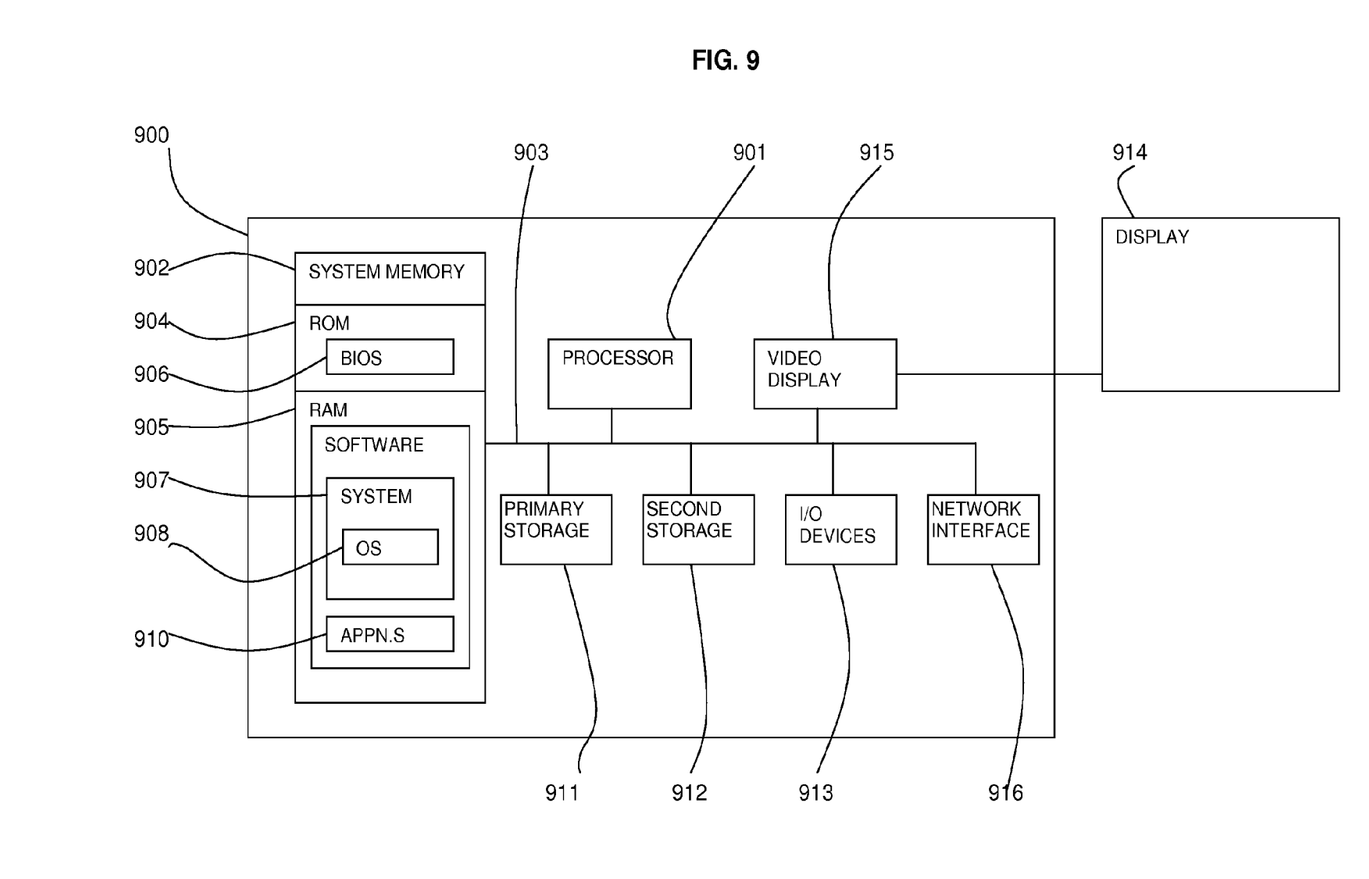
FIG. 9 is a block diagram of a computer system in which the present invention may be implemented.

Referring to FIG. 9, an exemplary system for implementing an IC design system includes a data processing system 900 suitable for storing and/or executing program code including at least one processor 901 coupled directly or indirectly to memory elements through a bus system 903. The memory elements can include local memory employed during actual execution of the program code, bulk storage, and cache memories which provide temporary storage of at least some program code in order to reduce the number of times code must be retrieved from bulk storage during execution.

The memory elements may include system memory 902 in the form of read only memory (ROM) 904 and random access memory (RAM) 905. A basic input/output system (BIOS) 906 may be stored in ROM 904. System software 907 may be stored in RAM 905 including operating system software 908. Software applications 910 may also be stored in RAM 905.

The system 900 may also include a primary storage means 911 such as a magnetic hard disk drive and secondary storage means 912 such as a magnetic disc drive and an optical disc drive. The drives and their associated computer-readable media provide non-volatile storage of computer-executable instructions, data structures, program modules and other data for the system 900. Software applications may be stored on the primary and secondary storage means 911, 912 as well as the system memory 902.

The computing system 900 may operate in a networked environment using logical connections to one or more remote computers via a network adapter 916.

Input/output devices 913 can be coupled to the system either directly or through intervening I/O controllers. A user may enter commands and information into the system 900 through input devices such as a keyboard, pointing device, or other input devices (for example, microphone, joy stick, game pad, satellite dish, scanner, or the like). Output devices may include speakers, printers, etc. A display device 914 is also connected to system bus 903 via an interface, such as video adapter 915.

The described method and system of design and modeling T-lines includes rules for proper design suggested for each type of on-chip T-lines, defining a minimal "sufficiently closed" environment for properly designed T-lines in dense VLSI design neighborhoods, and suggests a methodology for building self-contained models of properly designed T-lines in dense VLSI design neighborhoods.

The method as described above is used in the fabrication of integrated circuit chips. A design and modeling system may be provided as a service to a customer over a network.

The invention can take the form of an entirely hardware embodiment, an entirely software embodiment or an embodiment containing both hardware and software elements. In a preferred embodiment, the invention is implemented in software, which includes but is not limited to firmware, resident software, microcode, etc.

The invention can take the form of a computer program product accessible from a computer-usable or computer-readable medium providing program code for use by or in connection with a computer or any instruction execution system. For the purposes of this description, a computer usable or computer readable medium can be any apparatus that can contain, store, communicate, propagate, or transport the program for use by or in connection with the instruction execution system, apparatus or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read only memory (ROM), a rigid magnetic disk and an optical disk. Current examples of optical disks include compact disk read only memory (CD-ROM), compact disk read/write (CD-R/W), and DVD.

Improvements and modifications can be made to the foregoing without departing from the scope of the present invention.

We claim:

1. A method for design and modeling of transmission lines, comprising:
   identifying a critical path in an integrated electrical circuit;
   formulating design requirements for the critical path;
   choosing a transmission line core structure from a set of models of core structures in the critical path;
   identifying neighboring elements of the circuit that may affect a behavior of the core structure; and
   choosing transmission line geometry parameters based on the design requirements and on simulations using expanded core structure models that comprise models of the core structure and the neighboring elements.

2. The method as claimed in claim 1, wherein the design requirements are electrical and geometrical requirements.

3. The method as claimed in claim 1, wherein the expanded core structure models include different neighboring elements and parameter characteristics of the core structure and the neighboring elements are compared to determine an optimal model having a minimal sufficiently closed neighborhood environment.

4. A computer program product stored on a non-transitory computer readable storage medium for design and modeling of transmission lines, comprising computer readable program code means for performing the steps of:

identifying a critical path in an integrated electrical circuit;
formulating design requirements for the critical path;
choosing a transmission line core structure from a set of models of core structures in the critical path;
identifying neighboring elements of the circuit that may affect a behavior of the core structure; and
choosing transmission line geometry parameters based on the design requirements and on simulations using expanded core structure models that comprise models of the core structure and the neighboring elements.

5. The computer program product as claimed in claim 4, wherein the design requirements are electrical and geometrical requirements.

6. The computer program product as claimed in claim 4, wherein the expanded core structure models include different neighboring elements and parameter characteristics of the core structure and the neighboring elements are compared to determine an optimal model having a minimal sufficiently closed neighborhood environment.

* * * * *